US009140440B2

United States Patent
Jang

(10) Patent No.: US 9,140,440 B2
(45) Date of Patent: Sep. 22, 2015

(54) DISPLAY APPARATUS HAVING A HONEYCOMB CORE

(71) Applicant: LG DISPLAY CO., LTD., Seoul (KR)

(72) Inventor: Ji-Kwang Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/103,081

(22) Filed: Dec. 11, 2013

(65) Prior Publication Data

US 2014/0169006 A1 Jun. 19, 2014

(30) Foreign Application Priority Data

Dec. 14, 2012 (KR) .................. 10-2012-0146728

(51) Int. Cl.
| H05K 5/02 | (2006.01) |
| H05K 5/00 | (2006.01) |
| F21V 29/00 | (2015.01) |
| H05K 7/20 | (2006.01) |
| F21V 29/83 | (2015.01) |

(52) U.S. Cl.
CPC ............. *F21V 29/2293* (2013.01); *F21V 29/83* (2015.01); *H05K 5/02* (2013.01); *H05K 7/20963* (2013.01)

(58) Field of Classification Search
CPC ....... F21V 29/2293; F21V 29/83; H05K 5/02; H05K 7/2096
USPC ..................... 362/317, 382, 249.02
See application file for complete search history.

(56) References Cited

U.S. PATENT DOCUMENTS

| 4,606,960 A * | 8/1986 | Angel et al. .................. 428/116 |
| 5,738,924 A | 4/1998 | Sing |
| 7,371,451 B2 * | 5/2008 | Messinger ..................... 428/174 |
| 7,744,252 B2 * | 6/2010 | Maxik ........................... 362/294 |
| 2011/0079338 A1* | 4/2011 | Take et al. ....................... 156/60 |

FOREIGN PATENT DOCUMENTS

| CN | 101044001 A | 9/2007 |
| CN | 101142078 A | 3/2008 |
| CN | 201318656 Y | 9/2009 |
| CN | 101582507 A | 11/2009 |
| JP | 2008-276035 | 11/2008 |
| KR | 1020110130636 A | 12/2011 |

OTHER PUBLICATIONS

Kazunori,( Japanese Patent Application Publication 2008-276035,May 2007, machine translation).*
Lee et al. (Korean Patent Unexamined Patent Application Publication 10-2011-0130636, Jun. 2011, machine translation).*

(Continued)

*Primary Examiner* — Tracie Y Green
(74) *Attorney, Agent, or Firm* — Brinks Gilson & Lione

(57) ABSTRACT

A display apparatus includes a lower skin, a honeycomb core coupled to an inner upper surface of the lower skin by honeycomb patterns, an upper skin coupled to an upper surface of the honeycomb core, a fixing member coupled to the upper skin and the lower skin while extending through the upper skin and the lower skin, to fix a circuit including a light emitting diode to one end of the fixing member, and a filler interposed between the upper skin and the lower skin, to increase coupling force among the upper skin, the lower skin and the fixing member.

9 Claims, 7 Drawing Sheets

(56) References Cited

OTHER PUBLICATIONS

Office Action issued in corresponding Korean Patent Application No. 10-2012-0146728, mailed Jan. 28, 2014, 4 pages.

Office Action dated Jul. 1, 2015 for corresponding Chinese Application No. 201310683869.6, 12 pages.

Search Report dated Jun. 24, 2015 for corresponding Chinese Application No. 201310683869.6, 4 pages.

* cited by examiner

DISPLAY APPARATUS HAVING A HONEYCOMB CORE

This application claims the benefit of priority to Korean Patent Application No. 10-2012-0146728, filed on Dec. 14, 2012, which is hereby incorporated by reference as if fully set forth herein.

BACKGROUND

1. Field of the Disclosure

The present disclosure relates to a display apparatus, and, more particularly, to a display apparatus configured to easily fix a circuit to a metal plate member arranged at an inside or outside of the display apparatus while employing a honeycomb core.

2. Discussion of the Related Art

Generally, a honeycomb core exhibits a heat dissipation or heat insulation function in accordance with a honeycomb structure thereof. The honeycomb core is interposed between a pair of thin plate-shaped members, to provide reinforcement.

When such a structure employing a honeycomb core is used as a cover bottom in a display apparatus, to fix a circuit, there may be several restrictions in circuit fixing because thin plate members are coupled to opposite sides of the honeycomb core.

SUMMARY

A display apparatus includes a lower skin, a honeycomb core coupled to an inner upper surface of the lower skin by honeycomb patterns, an upper skin coupled to an upper surface of the honeycomb core, a fixing member coupled to the upper skin and the lower skin while extending through the upper skin and the lower skin, to fix a circuit including a light emitting diode to one end of the fixing member, and a filler interposed between the upper skin and the lower skin, to increase coupling force among the upper skin, the lower skin and the fixing member.

In another aspect, a display apparatus includes a lower skin, a honeycomb core coupled to an inner upper surface of the lower skin by honeycomb patterns, an upper skin coupled to an upper surface of the honeycomb core, a fixing member coupled to the upper skin and the lower skin while extending through the upper skin and the lower skin, to fix a circuit including a light emitting diode to one end of the fixing member, the fixing member comprising a flange protruding from an outer peripheral surface of the fixing member at a portion of the fixing member near the other end of the fixing member, and a filler interposed between the upper skin and the lower skin, to increase coupling force among the upper skin, the lower skin and the fixing member.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. It should be understood that the terms used in the specification and appended claims should not be construed as limited to general and dictionary meanings but be construed based on the meanings and concepts according to the spirit of the present invention on the basis of the principle that the inventor is permitted to define appropriate terms for best explanation.

Figure 1:
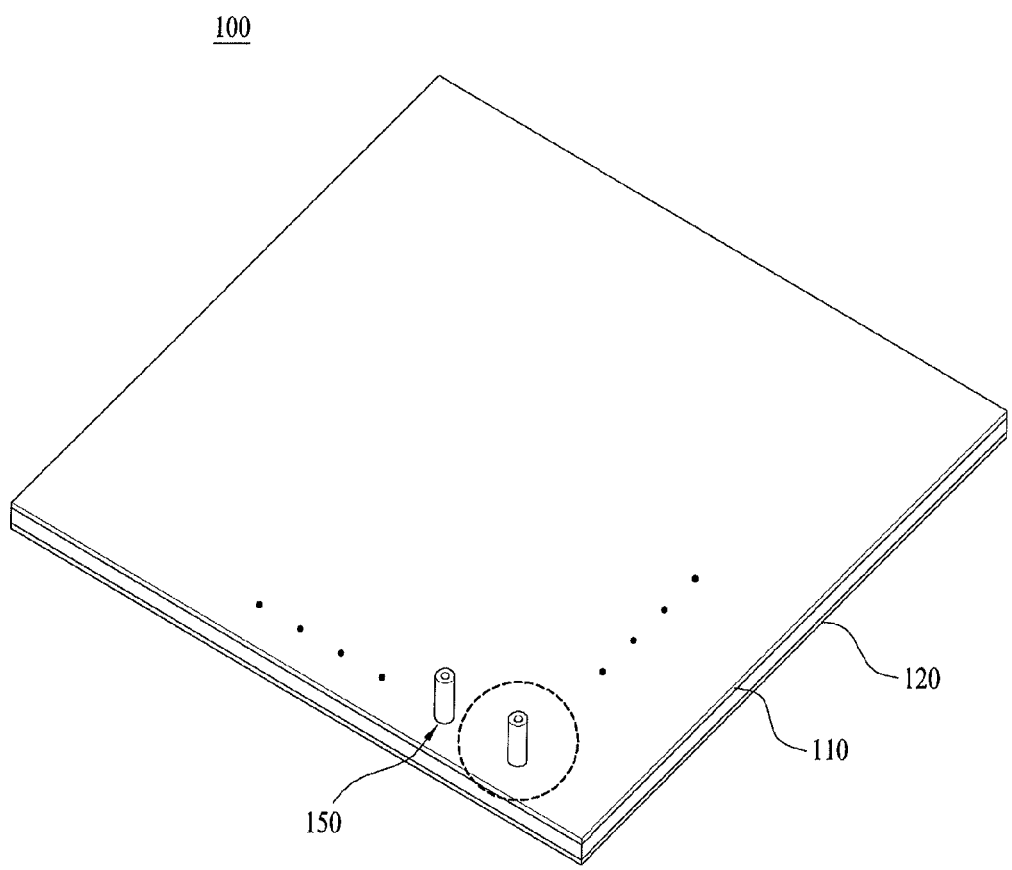
FIG. 1 is a perspective view illustrating a display apparatus according to a first embodiment of the present invention.
Figure 2:
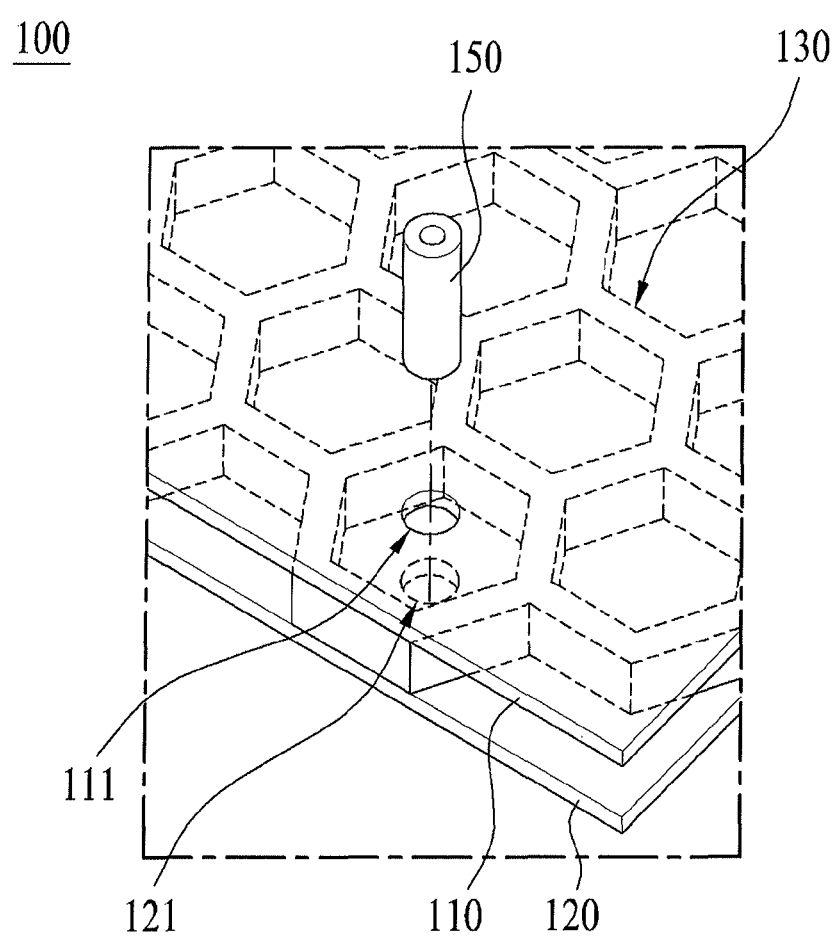
FIG. 2 is a projected perspective view partially illustrating the display apparatus illustrated in FIG. 1.
Figure 3:
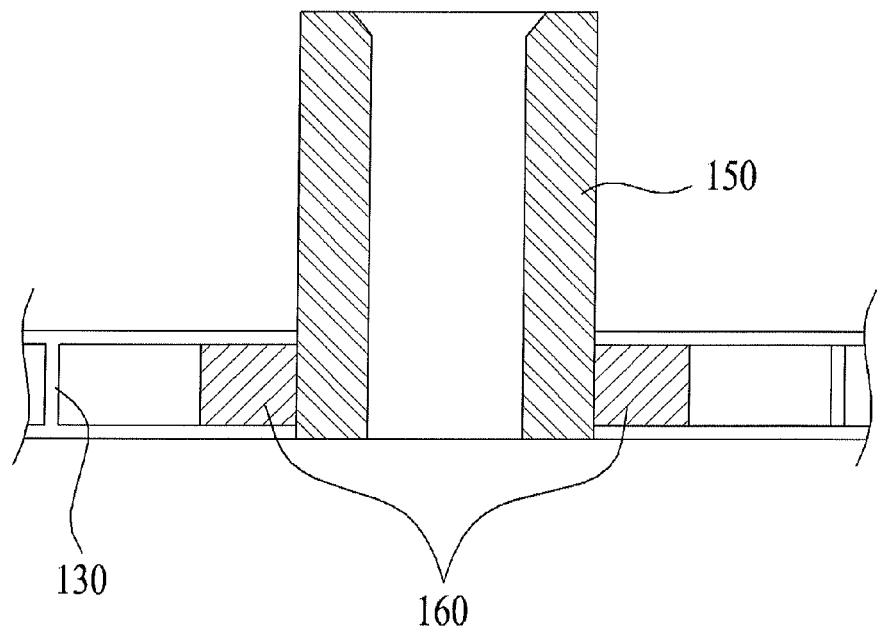
FIG. 3 is a sectional view illustrating the display apparatus of FIG. 1 at a front side.

FIG. 1 is a perspective view illustrating a display apparatus 100 according to a first embodiment of the present invention. FIG. 2 is a projected perspective view partially illustrating the display apparatus 100 illustrated in FIG. 1. FIG. 3 is a sectional view illustrating the display apparatus 100 of FIG. 1 at a front side.

Referring to FIGS. 1 to 3, a display apparatus 100 according a first embodiment of the present invention is illustrated. The display apparatus 100 includes an upper skin 110, a lower skin 120, a honeycomb core 130 firmly bonded between the upper skin 110 and the lower skin 120, and fixing members 150 fixed between the upper skin 110 and the lower skin 120.

Each of the upper and lower skins 110 and 120 may be formed of a metal plate exhibiting an excellent heat discharge performance, for example, an aluminum plate.

Referring to FIG. 1, the fixing member 150 is coupled to one end portion of the upper skin 110 corresponding to an upper portion of the upper skin 110, to protrude from the upper skin 110. A circuit (not shown) including a light emitting diode, an inverter, etc. is fixed to upper ends of the fixing members 150.

The honeycomb core 130, which is formed between the upper skin 110 and the lower skin 120 while having honeycomb patterns, provides a function of effectively dissipating heat generated from the circuit or effectively transferring the heat to a low-temperature outer peripheral area.

The upper and lower skins 110 and 120, which are formed of thin plates, may be used as an outer case of the display apparatus 100 through reinforcement of the upper and lower skins 110 and 120.

As illustrated in FIG. 2, first through holes 111 are formed through the upper skin 110, and second through holes 121 are formed through the lower skin 120.

A lower end of each fixing member 150 extends through a corresponding one of the first through holes 111, and is then fixed to an inner surface of a corresponding one of the second through holes 121. For convenience of description, the following description will be given only in conjunction with one fixing member 150, one first through hole 111, and one second through hole 121.

As illustrated in FIG. 3, a filler 160 is disposed between the upper skin 110 and the lower skin 120 around an extension line connecting the first and second through holes 111 and 121.

Thus, the fixing member 150 is bonded to the upper and lower skins 110 and 120 in a state in which an outer peripheral surface of the fixing member 150 at the lower end thereof contacts the first through hole 111, filler 160, and second through hole 121.

The filler 160 has a hollow cylindrical shape and, as such, communicates with the first and second through holes 111 and 121. The filler 160 is disposed to close a space defined between the upper and lower skins 110 and 120 around the extension line connecting the first and second through holes 111 and 121. The filler 160 is firmly bonded between the first and second through holes 111 and 121 in a forcible fitting manner.

The filler 160 is an adhesive containing at least one material selected from the group consisting of acryl resin, urethane resin, ether, epoxy resin, chloroprene rubber, silicon, phenol resin, and melamine resin-based materials. The filler 160 functions to enhance bonding force among the upper skin 110, lower skin 120, and fixing member 150.

Figure 4:
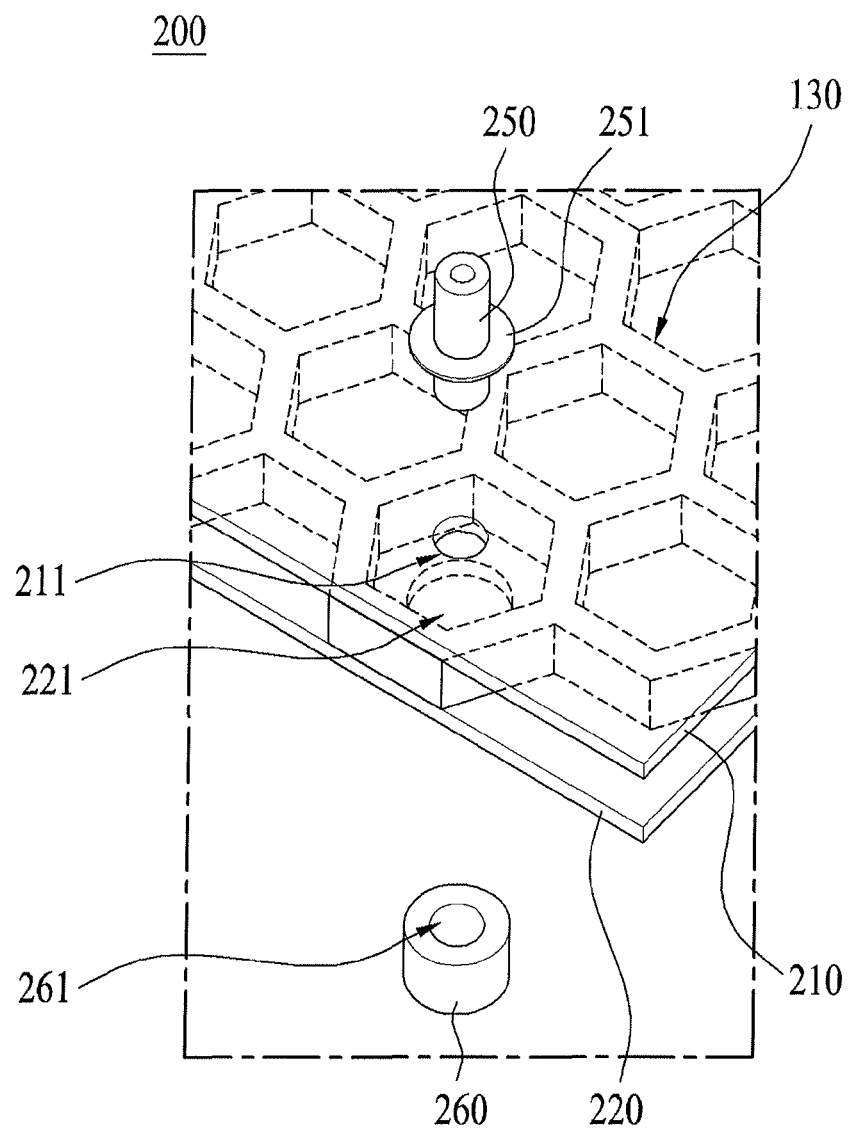
FIGS. 4 to 6 are perspective views partially illustrating a display apparatus according to a second embodiment of the present invention.
Figure 5:
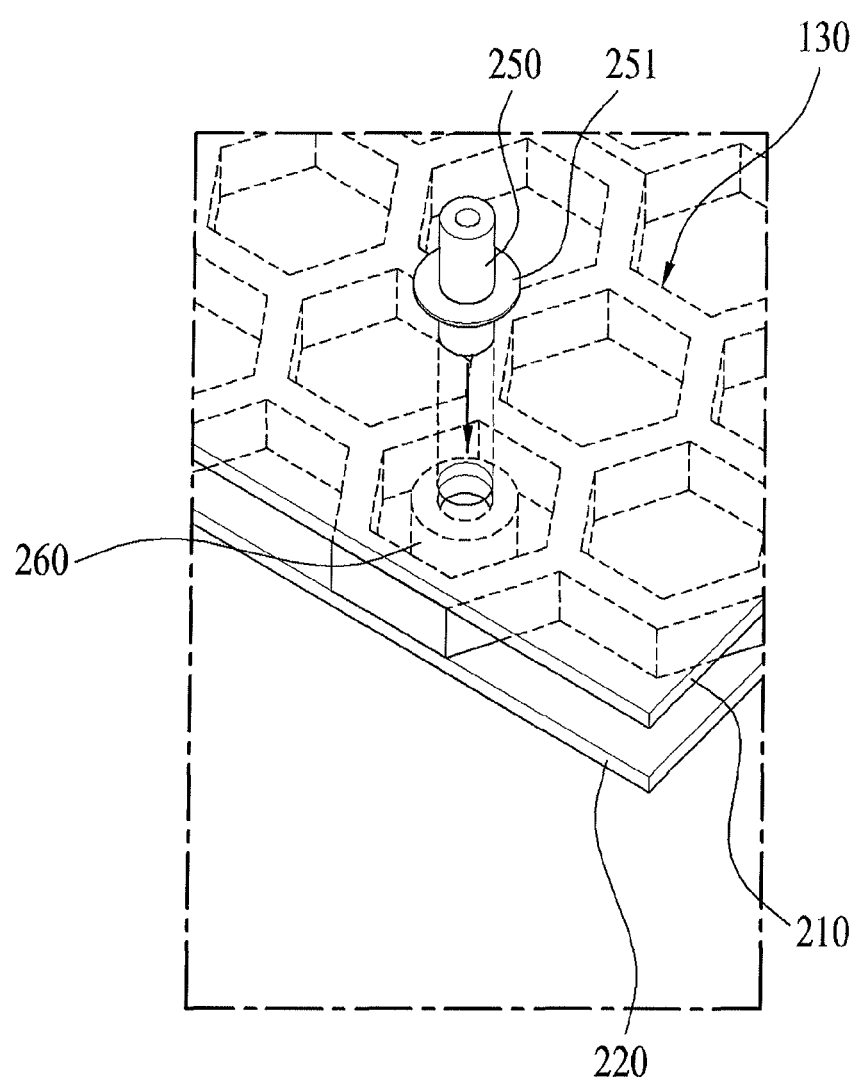
Figure 6:
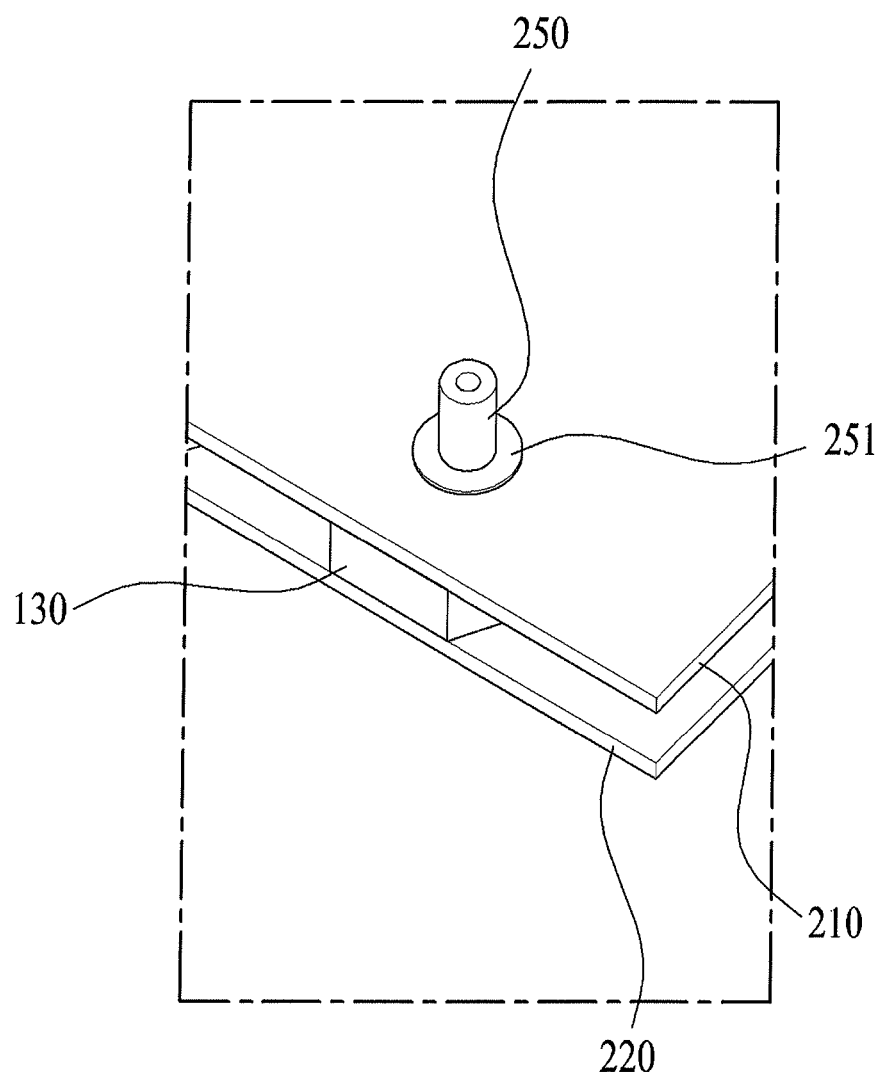

FIGS. 4 to 6 are perspective views partially illustrating a display apparatus 200 according to a second embodiment of the present invention. In the following description, the same reference numerals as those of the above description designate the same constituent elements.

Referring to FIGS. 4 to 6, the display apparatus 200 according to the second embodiment of the present invention includes an upper skin 210, a lower skin 220, a honeycomb core 230 firmly bonded between the upper skin 210 and the lower skin 220, and a fixing member 150 fixed between the upper skin 210 and the lower skin 220. The display apparatus 200 also includes a filler 260 for increasing bonding force of the fixing member 250.

FIGS. 4 and 5 show the interior of the display apparatus 200 through projection of the upper skin 210, to identify the honeycomb core 130. FIG. 6 shows a non-projection state of the upper skin 210 after completion of coupling of the fixing member 250.

Each of the upper and lower skins 210 and 220 may be formed of a metal plate exhibiting an excellent heat discharge performance, for example, an aluminum plate. The honeycomb core 230 is firmly bonded between the upper skin 210 and the lower skin 220. In the following description, differences of the second embodiment from the first embodiment will be described in more detail.

A first through hole 211 is formed through the upper skin 210, and a second through hole 221 having a greater diameter than the first through hole 211 is formed through the lower skin 220.

A lower end of the fixing member 250 extends through the first through hole 211, and is then accommodated in the second through hole 221.

The filler 260 is inserted into the second through hole 221, to be interposed between the upper skin 210 and the lower skin 220. The lower end of the fixing member 250 extending through the first through hole 211 is inserted into a hole 261 formed through the filler 260.

Thus, the fixing member 250 is bonded to the upper and lower skins 210 and 220 in a state in which an outer peripheral surface of the fixing member 250 at the lower end thereof contacts the first through hole 211 and hole 261.

A circuit is firmly coupled to one end of the fixing member 250. A flange 251 protrudes from the outer peripheral surface of the fixing member 250 at the other end of the fixing member 250.

When the other end of the fixing member 250 is inserted through the first through hole 211, the flange 251 comes into contact with an upper surface of the upper skin 210.

In this case, the area of the fixing member 250 contacting the upper skin 210 and lower skin 220 is increased and, as such, the bonding area of the fixing member 250 is increased. As a result, bonding force of the fixing member 250 is increased. Thus, in this embodiment, it is possible to expect an enhancement in assembleability of the fixing member 250 as well as an increase in coupling force of the fixing member 250 in accordance with an increase in the bonding area between the lower surface of the flange 251 and the upper skin 210.

Figure 7:
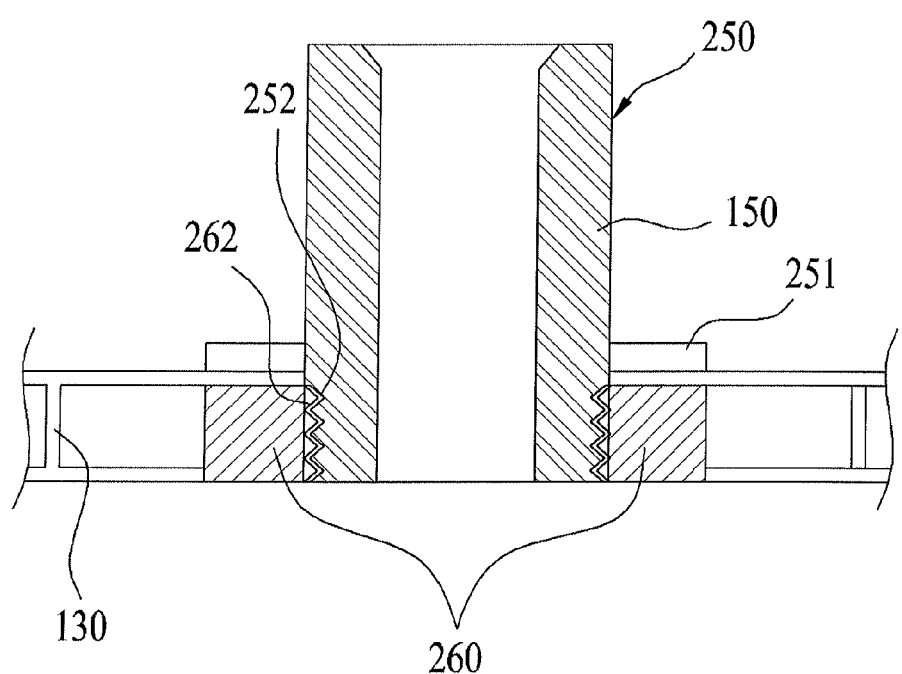
FIG. 7 is a sectional view illustrating a display apparatus according to a third embodiment of the present invention at a front side.

FIG. 7 is a sectional view illustrating a display apparatus 300 according to a third embodiment of the present invention at a front side.

Referring to FIG. 7, the display apparatus 300 according to the third embodiment of the present invention substantially has a similar configuration to the second embodiment. In the following description, only the differences of the third embodiment from the second embodiment will be described in detail. In the following description, the same reference numerals as those of the above description designate the same constituent elements.

The display apparatus 300 includes a fixing member 350, which is coupled to the upper skin 210, lower skin 220, and a filler 360 not only in a bonding manner, but also in a threadedly fastening manner.

Male threads 352 are formed at an outer peripheral surface of a lower end of the fixing member 350. Female threads 362 are formed at an inner peripheral surface of a hole 261 (FIG. 4) formed through the filler 360.

Accordingly, the fixing member 350 may be separably threadedly coupled to the upper skin 210 and filler 360. Thus, it may be possible to provide an enhancement in the assembly performance and coupling performance of the fixing member 350.

Hereinafter, functions and effects of the display apparatus 300 according to the third embodiment of the present invention will be described with reference to the accompanying drawings.

Referring to FIG. 7, the display apparatus 300 according to the third embodiment of the present invention includes the upper skin 210, the lower skin 220, the filler 360, and the fixing member 350. The fixing member 350 is coupled to the upper skin 210 and filler 360 in a state of extending through the upper skin 210 and filler 360.

The male threads 352 are formed at the outer peripheral surface of the lower end of the fixing member 350. The female threads 362 are formed at the inner peripheral surface of the hole 261 (FIG. 4) formed through the filler 360. Accordingly, thread coupling between the male threads 352 and the female threads 362 is achieved.

The filler 360 is inserted into a space between the upper skin 210 and the lower skin 220 through the second through hole 221 (FIG. 4) of the lower skin 220. The hole 261 has a diameter corresponding to the diameter of the first through hole 211 (FIG. 4) formed through the upper skin 210.

Accordingly, when the filler 360 is firmly bonded after being inserted into the second through hole 221, a hole having a diameter corresponding to the diameter of the first through hole 211 or the diameter of the hole 261 is formed. The fixing member 350 is coupled to the hole.

As described above, the lower end of the fixing member 350 is fixed to the inner surface of the through hole through thread coupling. The lower surface of the flange 251 extending horizontally from the outer peripheral surface of the fixing member 350 contacts the upper surface of the upper skin 210.

In this case, the fixing member 350 is separable when the coupling position thereof is not correct. Accordingly, it is possible to expect an enhancement in assembleability, as compared to the case in which the adhesive is used for coupling.

Once a desired coupling position of the fixing member 350 is set, the fixing member 350 is threadedly fastened. In this case, the lower surface of the flange member 251 may be bonded to the upper surface of the upper skin 210 by a separate adhesive.

Thus, it is possible to provide more firm coupling force among the fixing member 350, upper skin 210, and filler 360 in accordance with thread coupling and bonding.

As apparent from the above description, in accordance with the present invention, it is possible to enhance bonding force of a fixing member fixed between an upper skin and a lower skin coupled to opposite sides of a honeycomb core.

In addition, the assembly structure of the fixing member is simple, and separable coupling of the fixing member is possible. Accordingly, it is possible to expect an enhancement in assembly performance.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display apparatus comprising:
   a lower skin;
   a honeycomb core formed of honey patterns and coupled to the lower skin;
   an upper skin coupled to the honeycomb core, such that the honeycomb core is interposed between the upper skin and the lower skin;
   a fixing member including at least a portion inserted between the upper skin and the lower skin in a vertical direction, and a remainder portion protruded from the upper skin, wherein the fixing member is coupled to the honeycomb core, the upper skin and the lower skin by the inserted portion;
   a filler interposed between the upper skin and the lower skin, and surrounding the inserted portion of the fixing member, and
   a circuit including a light emitting diode and fixed on the upper skin by using the protruded remained portion of the fixing member.

2. The display apparatus according to claim 1, further comprising:
   a first through hole penetrating the upper skin; and
   a second through hole penetrating the lower skin,
   wherein the inserted portion of the fixing portion enters a space defined between the upper skin and the lower skin by the first through hole and coupled into the second through hole.

3. The display apparatus according to claim 2, wherein the filler is formed with hollow communicating with the first through hole and the second through hole, and closes the space defined between the upper skin and the lower skin around an extension line connecting the first and second through holes,
   wherein the filler is formed in a cylindrical shape.

4. The display apparatus according to claim 1, wherein the filler comprises an adhesive containing at least one material selected from the group consisting of acryl resin, urethane resin, ether, epoxy resin, chloroprene rubber, silicon, phenol resin, and melamine resin-based materials.

5. A display apparatus comprising:
   a lower skin;
   a honeycomb core formed of honey patterns and coupled to the lower skin;
   an upper skin coupled to the honeycomb core, such that the honeycomb core is interposed between the upper skin and the lower skin;
   a fixing member including at least a portion inserted between the upper skin and the lower skin in a vertical direction, and a remainder portion protruded from the upper skin, wherein the fixing member is coupled to the honeycomb core, the upper skin and the lower skin by the inserted portion;
   a flange extending from an outer peripheral surface of the protruded remainder portion of the fixing member and being contact with an outer surface of the upper skin;
   a filler interposed between the upper skin and the lower skin, and surrounding the inserted portion of the fixing member; and
   a circuit including a light emitting diode and fixed on the upper skin by using the protruded remained portion of the fixing member.

6. The display apparatus according to claim 5, further comprising:
   a first through hole penetrating the upper skin; and
   a second through hole penetrating the lower skin, the second through hole having a greater diameter than the first through hole,
   wherein the inserted portion of the fixing portion enters a space defined between the upper skin and the lower skin by the first through hole.

7. The display apparatus according to claim 6, wherein the filler is formed with a hollow having a diameter corresponding to the diameter of the first through hole, and is seated between the upper skin and the lower skin by the second through hole.

8. The display apparatus according to claim 7, wherein the inserted portion of the fixing member is contact with the hollow of the filler.

9. The display apparatus according to claim 7,
   wherein the fixing member comprises male threads formed at an outer peripheral surface of the inserted portion of the fixing member, and
   wherein the filler further comprises female threads formed at the hollow of the filler,
   wherein the fixing member is separably threadedly coupled to the filler by assembling the male threads and the female threads.

* * * * *